United States Patent [19]

Walsh

[11] Patent Number: 5,616,175
[45] Date of Patent: Apr. 1, 1997

[54] 3-D CARBON-CARBON COMPOSITES FOR CRYSTAL PULLING FURNACE HARDWARE

[75] Inventor: Paul J. Walsh, Salt Lake City, Utah

[73] Assignee: Herecules Incorporated, Wilmington, Del.

[21] Appl. No.: 278,744

[22] Filed: Jul. 22, 1994

[51] Int. Cl.⁶ ................................................. C30B 35/00
[52] U.S. Cl. ............................................. 117/14; 117/200
[58] Field of Search ................................. 117/200, 208; 156/148, 429; 423/447.1

[56] References Cited

U.S. PATENT DOCUMENTS

| 4,183,232 | 1/1980 | Banos et al. | 66/11 |
|---|---|---|---|
| 4,228,207 | 10/1980 | Porte et al. | 428/80 |
| 4,346,741 | 8/1982 | Banos et al. | 139/387 R |
| 4,393,669 | 7/1983 | Cahuzac | 66/13 |
| 4,492,096 | 1/1985 | Cahuzac | 66/11 |
| 4,519,290 | 5/1985 | Inman et al. | 87/7 |
| 4,631,931 | 12/1986 | Banos | 66/83 |
| 4,644,619 | 2/1987 | Cahuzac et al. | 28/100 |
| 4,779,429 | 10/1988 | Banos | 66/83 |
| 4,805,421 | 2/1989 | Cahuzac | 73/35 |
| 4,805,422 | 2/1989 | Cahuzac | 6/13 |
| 4,834,144 | 5/1989 | Tisne | 139/457 |
| 4,846,908 | 7/1989 | Aldrich et al. | 156/148 |
| 4,848,414 | 7/1989 | Cahuzac | 139/411 |
| 4,863,660 | 9/1989 | Cahuzac et al. | 264/103 |
| 4,917,756 | 4/1990 | Cahuzac et al. | 156/429 |
| 4,975,262 | 12/1990 | Suto et al. | 423/447.1 |
| 5,016,516 | 5/1991 | Aldrich et al. | 87/8 |
| 5,019,435 | 5/1991 | Cahuzac et al. | 428/36.1 |
| 5,207,992 | 4/1993 | Matsuo et al. | 117/208 |
| 5,217,770 | 6/1993 | Morris, Jr. et al. | 428/36.3 |
| 5,287,790 | 2/1994 | Akiyama et al. | 87/9 |
| 5,312,660 | 5/1994 | Morris et al. | 428/36.3 |

OTHER PUBLICATIONS

Handbook of Composites, vol. 4, *Fabrication of Composites*, Chpt. III, "Multidirectional Carbon–Carbon Composites", 1983.

D. Robbins, "Structural Components Produced by Modified Weaving Techniques", *Textile Inst. Ind.*, Mar. 1970, pp. 71–75.

Cahuzac et al. "The Automatic Weaving of 3D Contoured Preforms" 12th Nat'l SAMPE Tech. Conf., vol. 12, Oct. 7–9, 1980, 138–141.

R. S. Barton, "A Three–Dimensionally Reinforced Material", *SPE Journal*, May 1968, vol. 24, pp. 31–36.

P. D. Emerson, "Modern Developments in Three–Dimensional Fabrics" paper from Sep. 11, 1969 Amer. Assn. Textile Tech. meeting.

*Primary Examiner*—R. Bruce Breneman
*Assistant Examiner*—Felisa Garrett
*Attorney, Agent, or Firm*—Vidas, Arrett & Steinkraus, P.A.

[57] ABSTRACT

A piece of crystal pulling furnace hardware, especially one selected from among crucible holder tops, crucible holder bottoms, heaters, heat shields, and pedestals, is provided as a three-dimensional carbon-carbon composite. The enhanced physical properties of such a material provide advantages in the diameter of the crystal being pulled, the use of larger charges of crystallizable material in the furnace, and an increased life for the hardware.

10 Claims, 1 Drawing Sheet

3-D CARBON-CARBON COMPOSITES FOR CRYSTAL PULLING FURNACE HARDWARE

BACKGROUND OF THE INVENTION

1. The Field of the Invention

Semiconductor devices are generally manufactured from wafer-thin slices taken from a single crystal of a semiconductor composition, typically silicon, gallium arsenide, and other similar materials. The most common semiconductor devices are integrated circuits used as microprocessors and memory chips. An ingot of single crystal is obtained as a large boule from a molten bath of a crystallizable semiconductor material. A charge of the solid semiconductor material contained in a crucible is heated in a special furnace until the material melts. A rod having a seed crystal attached thereto, known as a crystal puller, is lowered into the molten bath and slowly withdrawn at a controlled rate that allows the melt to solidify and build up as a solidified single crystal at the end of the crystal puller. This single crystal, after cooling, is then sliced into wafers that are etched and further processed into high value semiconductor devices.

The present invention generally relates to furnace hardware formed from three-dimensional (3-D) carbon-carbon (C-C) composites, to methods for making such hardware, to a crystal pulling furnace apparatus incorporating such hardware, and to methods for manufacturing crystals using such hardware.

2. The State of the Art.

The crystal pulling furnace used in the manufacture of semiconductor materials contains predominantly polycrystalline graphite hardware; such a composition is conventionally chosen for the hardware because of its purity and ability to withstand the high temperatures of the crystal pulling process (approximately 1500° C. for silicon). More particularly, the semiconductor material to be melted and crystallized (silicon being used generally herein as an example) in the crystal pulling furnace is contained in a quartz (silica glass) crucible, which in turn is supported and heated through a graphite crucible holder (also called a "susceptor"). The graphite crucible holder is typically composed of a bottom bowl section and a mating cylindrical top. The entire container assembly all sits on a pedestal. The quartz crucible and the graphite crucible holder are radiatively heated by a surrounding graphite resistive heating element; surrounding the heating element is a heat shield, then a layer of insulation, and finally the inner wall of the furnace.

During each run of the furnace, silicon is placed into the quartz crucible and heated. As the temperature increases, both the graphite and the quartz expand. Graphite has a higher coefficient of thermal expansion (COTE) than quartz, but the quartz tends to soften and thus conform to the overlying graphite crucible holder; the softened nature of the quartz lessens thermal stress imposed by the crucible and the holder on each other that would be due to differences in their coefficients of thermal expansion. However, after the pulling process is completed and the furnace starts to cool down, the quartz freezes in its expanded state and restrains the graphite from contracting, thus imposing a hoop tensile load on the wall of the crucible holder. To avoid these cool down stresses, conventional practice is to machine a vertical expansion slot into the wall of the crucible holder. Without this expansion slot, the graphite crucible holder would typically fail after one cycle of the furnace. The use of this expansion slot allows the graphite crucible holder to withstand the hoop tensile stresses for about five to 25 pulls, depending upon the type of graphite used and the diameter of the crucible. Nevertheless, the crucible holder and other parts of the furnace and support equipment, usually made from polycrystalline graphite, must each be replaced on a rather frequent periodic basis; typical replacement times are at least monthly for the crucible holder top, approximately monthly for the heater, and approximately annually for the pedestal.

Matsuo et al., in U.S. Pat. No. 5,207,992, describe a crystal pulling apparatus including a two-dimensional C-C composite crucible holder. Two-dimensional (2-D) composites are generally made by winding carbon fiber into a cylindrical geometry and thereafter densifying.

The manufacture of three-dimensional carbon-carbon composites is generally known, and a description of such can be found in P. S. Bruno et al., "Automatically Woven Three-Directional Composite Structures", *SAMPE Quarterly*, vol. 17, no. 4, Jul. 1986, pp. 10–17, the disclosure of which is incorporated herein by reference. Bruno et al. describe the production of both two-dimensional and three-dimensional composites for such applications as nozzles, cones, and other parts for rocket motors, aircraft and aerospace structures, and end fitting joints. Likewise, L. E. McAllister, in "Multidirectionally Reinforced Carbon/Graphite Matrix Composites," *Engineered Materials Handbook*, Vol. 1- Composites (Metals Park, Ohio: ASM International 1987) (the disclosure of which is incorporated herein by reference), describes the manufacture of multidimensional woven preforms and their densification for use as aerospace components, turbine engines, and biocompatible materials.

Inman et al., in U.S. Pat. No. 4,519,290 (the disclosure of which is incorporated herein by reference), describe 4-D architecture braided fiber preforms to annular refractory articles such as an integral monolithic throat section and an exit cone for a rocket motor nozzle.

Suto et al., in U.S. Pat. No. 4,975,262, describe 3-D woven fabrics of pitch-derived carbon fibers having bent parts of a small radius of curvature (e.g., 4 mm); the fabrics are useful as one component of fiber-composite-material and as a reinforcing materials in plastics, metals, cements, and ceramics.

SUMMARY OF THE INVENTION

The general object of this invention is to provide three-dimensional (3-D) carbon-carbon (C-C) composite furnace parts that have improved properties and to improving the crystal pulling operation. Among the specific furnace hardware parts that can be improved by use this invention are the crucible holder top and bottom, the resistive heating element, the heat shield, and the pedestal. Among the improvements to the crystal pulling operation achieved by this invention are: less frequent part replacements due to increased part lifetimes; growth of higher purity semiconductor materials; a more uniform heating of the quartz crucible due to elimination of the machined thermal expansion slot; and increased crystal yield.

Yet another improvement achieved by this invention is the ability to grow larger diameter crystals; because an existing furnace has a fixed working volume, the improved properties of 3-D C-C composites allow these furnace parts to be made thinner, thereby allowing for a larger diameter quartz crucible to be used with larger charge of semiconductor material, and so a longer, larger diameter crystal can be pulled.

In summary, this invention provides a furnace part that comprises a three-dimensional carbon-carbon composite; particular exemplary furnace parts are selected from crucible holder tops and bottoms, heaters, heat shields, and pedestals. These carbon-carbon composites are generally formed by weaving a three-dimensional preform structure from carbon fiber or a carbonizable or pyrolyzable fiber, impregnating with an inert pyrolyzate-yielding precursor, preferably carbon or a carbon-yielding precursor, and thereafter graphitizing the impregnated preform to produce a dense 3-D carbon-carbon composite furnace part. Impregnation with carbon can be performed either (i) by infiltrating the structure with a carbonizable material and then carbonizing or (ii) by chemical vapor deposition using gaseous or liquid hydrocarbon sources.

the improved properties of such 3-D C-C composite materials allows this invention to provide a process for producing a single crystal from a molten bath of crystallizable material contained in a crucible, the crucible being contained in a crucible holder, by lowering a crystal puller having a seed crystal into the bath and withdrawing the crystal puller at a controlled rate effective to provide a solidified single crystal of the material, wherein the crucible holder comprises a 3-D C-C composite as the material of construction.

DESCRIPTION OF SPECIFIC EMBODIMENTS OF THE INVENTION

Figure 1:
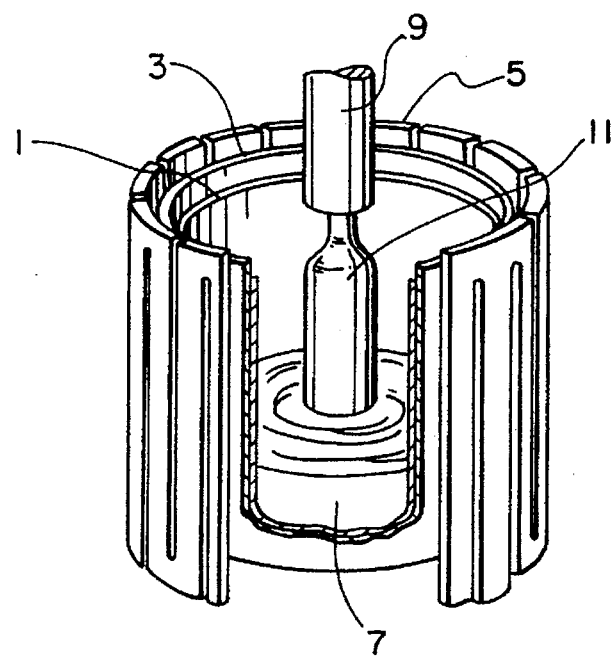
FIG. 1 depicts a cut-away view of furnace hardware in the operation of crystal pulling.
Figure 2:
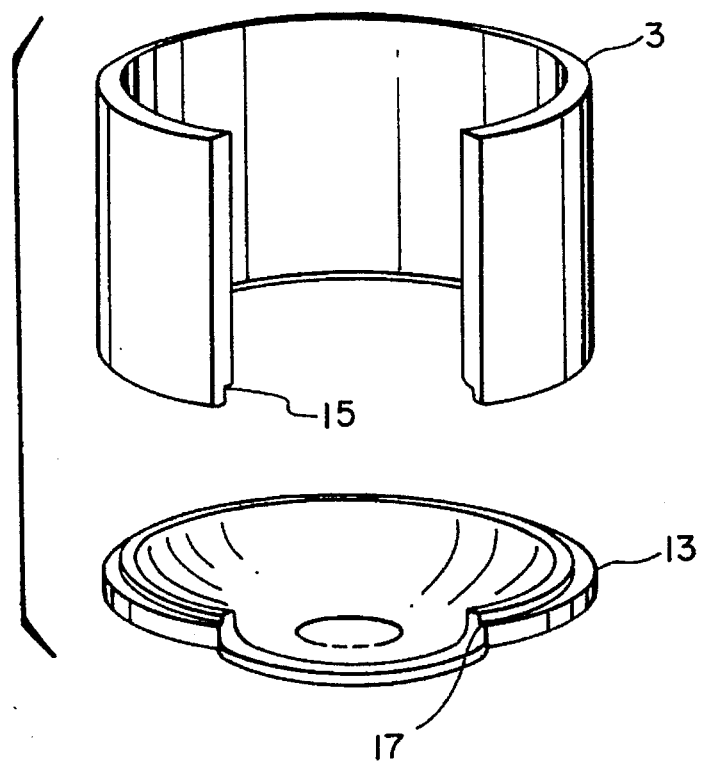
FIG. 2 depicts a cut-away, exploded view of a crucible holder top and an associated crucible holder bottom.

As described previously, this invention generally relates to hardware useful in crystal pulling furnaces, and specifically to three dimensional carbon-carbon composites (hereinafter "3-D C-C composites") used for such hardware. With reference to FIG. 1, a cut-away view is shown of the major hardware components in the environment of crystal pulling. More specifically, and also as described previously, the hardware is configured with an inner (quartz) crucible 1 surrounded by a crucible holder top 3, which in turn is surrounded by a resistive heating element 5. The heating element melts a charge of the crystallizable material into a molten bath 7. A crystal puller 9 having a seed crystal attached to its end is dipped into the molten bath and withdrawn in a controlled manner effective to cause a crystal 11 to be grown from the seed. FIG. 2 depicts a cut-away, exploded view of the crucible holder top 3 and the crucible holder bottom 13 in which the quartz crucible is retained. The crucible holder top and bottom have respective lips 15 and 17 which allow the top to be retained in and aligned with the bottom. As mentioned in the Background section, the entire assembly shown in FIG. 1 is supported on a pedestal (not shown); also, a heat shield is typically provided surrounding the resistive heating element.

The present invention provides 3-D C-C composites useful for such crystal pulling furnace hardware as the crucible holder bottom, the crucible holder top, the heating element, the heat shield, and the pedestal.

The manufacture of 3-D C-C composites in various shapes, as mentioned above, is generally known (e.g., the aforementioned Bruno et al. and McAllister articles, as well as L. E McAllister et al., "Multidirectional Carbon-Carbon Composites," Chpt. III in Vol. 4-"Fabrication of Composites" in *Handbook of Composites* (New York: Elsevier Science Publishing, 1983), the disclosure of all of which are incorporated herein by reference). To start, fibers are woven into a desired 3-D preform geometry. Suitable fibers are generally carbon fibers, such as those of the Magnamite carbon fiber series (including AS series such as AS-1 and AS-4, IM series such as IM-6, and UHM series carbon fibers; available from Hercules Incorporated, Wilmington, Del.), those of the Thornel carbon fiber series (such as P-25, P-55, P-105WG, and PAN T-300 carbon fibers; available from Amoco Performance Products, Alpharette, Ga.), those of the Torayca carbon fiber series (such as M 40, M 30, T-300, and T-400 G carbon fibers, available from Toray Industries, Japan), those of the Avcarb carbon fiber series (such as G-160, available from Avco-Textron, Providence, R.I.), those of the Microill carbon fiber series (including such grades as 40 and 55, available from Fiber Materials Inc., Biddeford, Me.), and those of the Sigrifil carbon fiber series (such as grade C fibers, available from Sigri Elektrograhphit GmbH, Germany). Pitchbased fibers (such as sold under the P-25, P-55, and P-105WG by Amoco Performance Products) are also suitable for weaving a 3-D structure that can be formed into a dense 3-D C-C composite. Other ceramic fibers, or precursor fibers, pyrolyzable to a ceramic form, and especially pyrolyzable to such compositions as silicon nitride or silicon carbide, as well as compatible combinations of all of these suitable types of fibers, are also suitable; silicon carbide fibers can be provided as described by Yajima et al. in U.S. Pat. No. 4,100,233, and silicon nitride fibers can be provided as described by Okamura et al. in U.S. Pat. No. 4,954,461, the disclosures of which are incorporated herein by reference.

The fibers can be woven into a 3-D structure having any of a variety of configurations by techniques known in the art using commercially available equipment, such as described in by Bruno et al., McAllister, Banos et al. (in U.S. Pats. Nos. 4,779,429, 4,631,931, 4,346,741 and 4,183,232, the disclosures of which are incorporated herein by reference), and Cahuzac (in U.S. Pat. Nos. 5,019,435, 4,863,660, 4,848, 414, 4,805,421, 4,644,619, 4,492,096 and 4,393,669, the disclosures of which are all incorporated herein by reference). For the purposes of this invention, the 3-D structures will typically have such configurations as cylindrical or cylindrically arcuate for making such furnace hardware as the crucible holder top and the heating element, or a sheet or block geometry (i.e., rectilinear) for making such hardware as the crucible holder bottom and the pedestal. Such preforms are typically woven using bundles of fibers. The maximum density of such a woven preform would be achieved using square or rectilinear bundles, but those bundle (cross-sectional) geometries are not commercially available. Thus, when weaving with circular or oval bundles, the density of the woven preform is preferably on the order of 40% to 55% by volume (i.e., volume of fiber to total volume of the preform) for the 3-D C-C composites of this invention; such a density translates into an actual density of approximately 0.7 to 0.8 g/cc when carbon fibers are used.

As mentioned above, different types of fiber compositions are suitable to the extent they are graphitizable or yield a pyrolyzate that is compatible with the silicon (or other semiconductor) materials and furnace hardware components present during the crystal pulling operation. Pitch-based fibers, for example, have a relatively higher thermal conductivity (than other carbon fibers), and thus could be appropriately placed in a particular location or arrangement for a particular piece of furnace hardware: for the crucible holder top, in which it is desired to transmit heat from the heating element radially across the holder and into the semiconductor material, pitch fibers should be placed radially in the woven preform. Similarly, pitch fibers also have a relatively higher electrical conductivity, and so would be preferentially arranged for the resistive heating element in the axial and/or circumferential directions to promote conduction of the electric heating current. The quartz crucible is used in the crystal hardware to provide chemical isolation from the graphite pieces of hardware and thereby prevent the formation of silicon carbide in the molten bath. The use of silicon nitride fibers for the crucible and the crucible holder top would obviate the need to use a quartz crucible, thereby providing the benefits of eliminating the quartz crucible, allowing for a larger charge of silicon to be heated, and providing a system with fewer impurities.

The 3-D structure may be considered a preform, such as a cylinder for the crucible holder top, or may require further shaping into a desired preform geometry, such as shaping a sheet into a hemisphere for fabrication into a crucible holder bottom. Shaping is typically performed, as with standard graphite parts, by machining.

The preform can be densified by first being impregnated with carbon and then graphitized in a number of ways, including (i) infiltration with a carbonizable material, carbonization, and then graphitization, or (ii) by chemical vapor deposition (CVD) carbon impregnation using gaseous or liquid hydrocarbon sources and then graphitization.

In the former method, the preform in the desired geometry is first infiltrated with a material suitable for carbonization and graphitization. Exemplary infiltration materials are typically carbonizable liquids, and include petroleum and coal tar pitches, high carbon yield resins, and the like, and compatible mixtures or combinations thereof. The infiltration material may be a solid at ambient conditions and liquefiable, such as by melting, suitable for infiltration. High yield carbon resins are generally those that yield at least 40% carbon after pyrolyzation (graphitization), and include such resins as Grade SC-1008, a phenolic resin (available from Borden, Columbus, Ohio), A-70 and A-240 pitches (available from Ashland Oil Company, Ashland, Ky.), and resins based on furfuryl alcohol. Any infiltration that yields a pyrolyzate that is inert in the crystal pulling environment is suitable, and carbon-yielding precursor materials are preferred. In this process where the infiltration material is normally solid at ambient conditions, the preform is placed into an isolated container and a powder of the infiltration material is packed around the part. A vacuum is applied to evacuate the container, after which the container is heated to melt the infiltration material and pressure is applied to force the molten infiltration material into the voids in the preform. Accordingly, in addition to clean pyrolyzation, the infiltration material should have a melt viscosity effectively sufficiently low to allow it to flow into and fill the preform voids.

After infiltration, the preform is preferably rigidized, especially by carbonization. The pressure for the carbonization process is at least atmospheric, and more preferably in the range of 200–600 psi, with about 400±50 psi being preferred, although pressures of at least 10,000 psi, or on the order of at least 15,000 psi, are also useful. The carbonization temperature is typically at least 500° C., with heat treatment temperatures on the order of at least 700° C. preferred. Carbonization is performed in an inert, preferably oxygen free, atmosphere. Typical times required for carbonization are dependent upon the volume of the part being processed. The result of infiltration and then carbonization is a carbon-impregnated preform.

The preform is subjected to graphitization prior to use in a crystal pulling operation, at a temperature of at least about 2000° C., with 2500°±100° C. being preferred. Graphitization is preferably preformed in an inert atmosphere, most preferably either in helium, argon, nitrogen, or a mixture thereof, or in a vacuum. Carbonization is preferred but not essential for an impregnated preform prior to graphitization.

The process of producing a graphified piece of furnace hardware may comprise one or more carbonization steps, one or more graphitization steps, and various combinations and permutations thereof. Generally, graphifization is performed to induce micro-cracking of the preform and thereby provide flow avenues for further impregnation. As the process(es) of infiltration, carbonization, and graphitization proceed, the outer pores of the preform typically become clogged, so optional machining of the outer surface of the preform during one or more cycles of steps can be performed to expose larger pores for infiltration. A final graphitization step is desired to assure that the furnace part is inert and does not evolve gases that would cause impurities in the crystal product in the crystal pulling environment. These infiltration, carbonization, and graphitization steps are thus performed to achieve a desired product, at the lowest manufacturing cost, and in the shortest amount of time. In one preferred scheme of processing steps: (i) the preform is infiltrated, carbonized at about 450 psi and at least about 500° C., and graphitized at about 4500° C.; (ii) step (i) is repeated at least once; (iii) the preform is then subjected to a cycle of infiltration, then carbonization at about 15,000 psi and at least about 500° C., and finally graphitization at about 4500° C.; and (iv) step (iii) is repeated at least once, preferably three times.

In the latter of the above-mentioned carbon impregnation processes, the preform is CVD-impregnated with carbon. CVD carbon infiltration is described by W. V. Kotlensky, in "A Review of CVD Carbon Infiltration of Porous Substrates" (presented at the 16th National SAMPE Symposium in Anaheim, Calif., Apr. 21–23, 1971; the disclosure of which, and the references cited therein, are incorporated herein by reference). In general, during carbon impregnation by CVD the preform is placed into a heated chamber and a carbon source gas or liquid is admitted to the chamber; the carbon source gas is typically natural gas, methane, or benzene mixed with hydrogen. The CVD-impregnated preform is then graphitized as described above. At this point, any machining (such as the lips shown in FIG. 2, or the surface to promote further impregnation) is undertaken. As with the impregnation process, it may be desirable to repeat this cycle of CVD impregnating and graphitizing one or more times. Final densities for furnace hardware produced by this method are generally above 1.3 g/cc, and typically in the range of 1.5 to 1.7 g/cc.

Furnace hardware may also be fabricated using a combination of the two carbon impregnation techniques described. Regardless of whether the furnace articles of this invention are made by infiltration, carbonization, and graphitization, or CVD-impregnation and graphitization, or some combination thereof, the final heat treatment temperature should be greater than the temperature at which the part is intended to be used.

A final density of about 1.8 g/cc is preferred for the present applications of these 3-D C-C composites; graphite has a theoretical density of 2.26 g/cc, and useful crystal pulling articles according to this invention should have a density of at least about 1.6 g/cc. 3-D C-C composites for rocket, other aerospace, and similar applications typically have a density of at least about 1.88 g/cc, based on a woven density of at least about 45% (by volume of fibers), with a tight spacing of about 0.78 mm (axial to circumferential weave). in contrast, 3-D C-C composite articles for crystal pulling operations are generally useful with a density of at least about 1.6 g/cc, based on a woven density of at least about 35%, with a looser spacing of about 2.00 mm (axial to circumferential). The tighter spacing and higher density of conventional 3-D C-C composites for rocket and aerospace applications requires a weaving time of about three weeks to provide the initial preform. The less stringent density requirements of crystal pulling furnace hardware allows for faster weaving, on the order of one-third to one-half of the time required for conventional 3-D C-C composites. Thus, this invention provides articles can that be woven in a significantly shorter period of time than would be expected with conventional 3-D C-C composites.

Prior to utilization in a crystal pulling environment, it may be desirable to purify the furnace part. Purification to less than 10 ppm total ash can be accomplished by heating the part to a temperature in excess of 1500° C. in a halogen, preferably chlorine, atmosphere.

The final product is then used in a crystal pulling apparatus. As described above, one of the present desires of the art is to provide semiconductor crystals having larger diameters; the art has discovered that semiconductor chip yields increase as larger diameter crystals are grown. The use of a 3-D C-C composite as a crucible holder top allows such a part to be made with thinner profile, thereby allowing for the growth of longer, larger diameter crystals. For example, a typical crystal pulling furnace may have a hot zone that accommodates a 30 kg charge of silicon and, with a 14" hot zone, will typically pull a 4" diameter crystal. Although a 5" diameter crystal could be grown in the same furnace, relying upon the same charge capacity (30 kg) produces a shorter crystal. A thinner profile for the crucible holding elements frees-up some furnace volume, allowing a larger silicon charge to be used, and thereby providing a longer, larger diameter crystal; of course, a larger quartz crucible would also be required. Yet another advantage to using a 3-D C-C composite crucible holder having a thinner profile, the larger size of which can accommodate a larger quartz, crucible, is that the surface area available for heating the silicon charge is increased. The larger available surface area provides for an increased oxygen evaporation rate from the silicon, thereby lowering the oxygen content of the molten silicon bath, and thus increasing the quality of the crystal product. Still a further advantage of using 3-D C-C composites is the purity of the final part; graphite articles from pitch typically start at an impurity level of 500 ppm (generally consisting of trapped metal residues that react with silicon) and are purified to a level of 10–50 ppm, whereas C-C composites are initially made with an impurity level on the order of 10–50 ppm and are purified to a level of less than one part per million.

The 3-D C-C composites can also be made into parts useful for other semiconductor processing operations, such as epitaxial deposition susceptors and wafer processing and handling apparatus.

EXAMPLE 1

A 3-D C-C composite crucible holder top was made by weaving AS-4 grade carbon fibers on an Aerospatiale weaving machine (see Bruno et al. article) into a cylindrical geometry with the approximate measurements 17" (outer diameter)×9.5" (inner diameter)×51" (height). A graphite mandrel was placed within the crucible holder preform to maintain the geometry of the preform during densification.

The crucible holder preform was carefully lifted and loaded into a steel can. The can was filled with a sufficient volume of A70 pitch to assure that the preform would be immersed in liquid pitch during melting. The can containing the preform and pitch was placed into an autoclave, the atmosphere evacuated to remove gases entrapped in the preform, and heat was applied to the can to melt the pitch. After the pitch had melted, the autoclave was pressurized to infiltrate the molten pitch into the pores of the preform. The autoclave was allowed to cool, after which the pressure was normalized to atmospheric. The impregnated preform was placed in a carbonization furnace and heated to a temperature in excess of 600° C. at a controlled rate in order to pyrolyze the pitch and render it solid, producing a C-C composite log in the can.

After carbonization the C-C log was cut out of the can and placed in a graphitization furnace. The preform was graphitized in an inert atmosphere at a temperature of 2450° C.

The foregoing steps of carbonization and graphitization were then repeated once and then the surface of the part was roughened by machining.

The log was then infiltrated with pitch in a can as described previously. After removal from the autoclave, the lid was welded onto the can to form a leak tight seal, and the sealed can was then placed into a high pressure autoclave. The can was again heated to melt the pitch, and the pressure was increased to 15,000 psi. The pitch was carbonized under pressure at a temperature greater than 600° C. The can was then removed from the autoclave and graphitized as just described. The immediately foregoing steps of high pressure carbonization and graphitization were repeated three time to achieve a final density for the C-C log of at least 1.88 g/cc. The C-C log was machined into a crucible holder having a 13" inner diameter and a 12" outer diameter (½" wall thickness) as well as various rocket nozzle parts.

EXAMPLE 2

For a crucible holder, the part made in Example 1 was used alternately with a standard graphite crucible holder bottom for over 200 crystal pulls, significantly and unexpectedly improved from the 5–25 pulls typically achieved for such hardware before failure. Of the 200 pulls, the data in Table 1 of this example show a comparison of the length of dislocation free crystal per pull when using standard graphite and when using a 3-D C-C composite for 36 pulls.

TABLE 1

| | Inches of Dislocation Free Crystal | |
|---|---|---|
| Pull Number | Standard Graphite | 3-D C-C Composite |
| 1 | | 28.8 |
| 2 | 29.3 | |
| 3 | | 29.2 |
| 4 | 29.9 | |
| 5 | | 20.7 |
| 6 | 28.0 | |
| 7 | 22.3 | |
| 8 | | 29.3 |
| 9 | 23.7 | |
| 10 | | 26.5 |
| 11 | | 23.6 |
| 12 | 27.9 | |
| 13 | | 28.9 |
| 14 | 28.1 | |
| 15 | | 28.6 |

TABLE 1-continued

| Pull Number | Inches of Dislocation Free Crystal | |
| --- | --- | --- |
| | Standard Graphite | 3-D C-C Composite |
| 16 | 25.0 | |
| 17 | | 24.4 |
| 18 | 28.3 | |
| 19 | | 28.5 |
| 20 | 27.1 | |
| 21 | | 29.4 |
| 22 | 29.2 | |
| 23 | | 30.3 |
| 24 | 18.4 | |
| 25 | | 25.3 |
| 26 | | 25.7 |
| 27 | 24.5 | |
| 28 | | 29.5 |
| 29 | 29.1 | |
| 30 | | 27.7 |
| 31 | 15.5 | |
| 32 | | 28.9 |
| 33 | 27.0 | |
| 34 | | 27.4 |
| 35 | 26.8 | |
| 36 | | 27.1 |

Using the results shown in Table 1, the respective mean lengths of dislocation free crystal for standard and 3-D C-C composite crucible holder tops were 25.9 and 27.4, and standard deviations for the same were 4.00 and 2.46. The longest respective lengths were 29.9 inches and 30.3 inches, while the shortest respective lengths were 15 ½ inches and 20.7 inches. The furnace articles of this invention thus provide a better crystal product having, on average, a longer length of dislocation free area than a crystal produced using a conventional graphite article in the same crystal pulling operation.

The present invention has been described with reference to the foregoing embodiments and examples without being limited by the particular content thereof, and various additions, substitutions, deletions, and other modifications thereof are intended to be within the scope and spirit of the invention as defined by the following claims.

What is claimed is:

1. A piece of crystal pulling furnace hardware, wherein said hardware is selected from the group consisting of crucible holder tops, crucible holder bottoms, heaters, and pedestals, and wherein said hardware comprises a three-dimensional carbon-carbon composite.

2. The hardware of claim 1, wherein the piece of hardware is a crucible holder top.

3. The hardware of claim 2, wherein the crucible holder top has a cylindrical geometry, and wherein the crucible holder top comprises "pitch-based" fibers disposed radially therein.

4. The hardware of claim 1, wherein the piece of hardware is a crucible holder bottom.

5. The hardware of claim 1, wherein the piece of hardware is heater having a cylindrical geometry defined by radial, axial, and circumferential directions.

6. The hardware of claim 5, wherein the heater comprises pitch-based fibers disposed axially therein.

7. The hardware of claim 5, wherein the heater comprises pitch-based fibers disposed circumferentially therein.

8. A furnace apparatus for use in pulling crystals from a molten bath of a crystallizable material, said apparatus including a piece of furnace hardware comprising a three-dimensional carbon-carbon composite.

9. The furnace apparatus of claim 8, wherein the piece of furnace hardware is selected from the group consisting of crucible holder tops, crucible holder bottoms, heater, and pedestals, and wherein the furnace hardware has an impurity level of no more than 10 ppm.

10. The furnace apparatus of claim 9 comprising at least two pieces of furnace hardware, each of said pieces comprising a three-dimensional carbon-carbon composite.

* * * * *

UNITED STATES PATENT AND TRADEMARK OFFICE
CERTIFICATE OF CORRECTION

PATENT NO.  : 5,616,175

DATED       : April 1, 1997

INVENTOR(S) : PAUL J. WALSH

It is certified that error appears in the above-identified patent and that said Letters Patent is hereby corrected as shown below:

Column 3, line 15:   Delete "the" and insert -- The --;

Column 4, line 17:   Delete "Microill" and insert -- Microfil --;

Column 5, line 52:   Delete "pyrolyzafion" and insert -- pyrolyzation --;

Column 6, line 11:   Delete "graphifizafion" and insert -- graphitization --;

Column 6, line 18:   Delete "graphitizafion" and insert -- graphitization --;

Column 6, line 21:   Delete "graphitizafion" and insert -- graphitization --;

Column 7, line 2:    Delete "fight" and insert -- tight --; and

Column 10, line 32:  Delete "heater" and insert -- heaters --.

Signed and Sealed this

Twenty-third Day of December, 1997

Attest:

BRUCE LEHMAN

Attesting Officer

Commissioner of Patents and Trademarks